United States Patent
Chen et al.

(10) Patent No.: US 8,509,369 B2
(45) Date of Patent: *Aug. 13, 2013

(54) FREQUENCY SYNTHESIS SYSTEM WITH SELF-CALIBRATED LOOP STABILITY AND BANDWIDTH

(75) Inventors: Chun-Liang Chen, Yongkang (TW); Hui-Chun Hsu, Bade (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 1100 days.

This patent is subject to a terminal disclaimer.

(21) Appl. No.: 12/457,354

(22) Filed: Jun. 9, 2009

(65) Prior Publication Data

US 2010/0067612 A1    Mar. 18, 2010

(30) Foreign Application Priority Data

Sep. 15, 2008    (TW) ................................ 97135332 A

(51) Int. Cl.
*H03D 3/24*        (2006.01)
(52) U.S. Cl.
USPC ........... 375/374; 327/147; 327/156; 375/215; 375/294; 375/327; 329/307; 329/360; 455/180.3

(58) Field of Classification Search
None
See application file for complete search history.

(56) References Cited

U.S. PATENT DOCUMENTS

| | | | |
|---|---|---|---|
| 4,965,531 A | 10/1990 | Riley | |
| 6,522,366 B1* | 2/2003 | Onodera et al. | 348/638 |
| 7,405,630 B2* | 7/2008 | Jensen | 331/17 |
| 2006/0214737 A1* | 9/2006 | Brown et al. | 331/16 |
| 2008/0174361 A1 | 7/2008 | Gomez | |

* cited by examiner

*Primary Examiner* — Adolf Dsouza
(74) *Attorney, Agent, or Firm* — Bacon & Thomas, P.L.C.

(57) ABSTRACT

A frequency synthesis system with self-calibrated loop stability and bandwidth, which outputs an output signal based on an input signal and includes a detector, a charge pump, a filter, a controllable oscillator and a programmable frequency divider. The detector produces a detection signal based on a logic level difference between the input signal and a feedback signal. The charge pump is connected to the detector in order to produce a control signal based on the detection signal. The filter is connected to the charge pump in order to produce a tuning signal based on the control signal. The controllable oscillator is connected to the filter in order to produce the output signal based on the tuning signal. The programmable frequency divider is connected to the controllable oscillator in order to produce the feedback signal based on the output signal. The filter is a discrete time loop filter.

16 Claims, 12 Drawing Sheets

FREQUENCY SYNTHESIS SYSTEM WITH SELF-CALIBRATED LOOP STABILITY AND BANDWIDTH

BACKGROUND OF THE INVENTION

1. Field of the Invention

The present invention relates to a phase-locked loop (PLL) and, more particularly, to a frequency synthesis system with self-calibrated loop stability and bandwidth.

2. Description of Related Art

In wireless receiving systems, a widely adaptive frequency synthesizer for television receivers, WiMax receivers and the like is a tough challenge on design. For each output frequency of the frequency synthesizer, the parameters (such as the frequency of an input signal, a multiplication factor, etc.) have to be accurately adjusted for minimizing the phase noises and maintaining the stability of the frequency synthesizer.

In the frequency synthesizer, the loop bandwidth indicates the response speed, and preferably is 1/20 of the reference frequency. The damping factor indicates the stability of the frequency synthesizer, and preferably is close to one. The systematic parameters above are related to special circuit parameters such as a charge pump current and the resistance of a filter. Therefore, the loop bandwidth and the damping factor will be varied with input/output frequencies, multiplication factors, and the like.

The various output frequencies and multiplication factors lead to different PLLs on design for different applications. Such a way increases complication in management and also development cost for different PLL designs and tests. A solution for this problem is to apply a complicated circuit and algorithm in one PLL to meet the various output frequencies and the multiplication factors. Namely, a single PLL is designed and applied in different ICs. In such a design, the loop bandwidth and the damping factor require an automatic tuning mechanism to meet with various input frequencies, output frequencies and multiplication factors in different applications.

The parameters of an adaptive PLL can be adjusted to meet the desired output frequencies and multiplication factors. The adaptive PLL can reach to a fixed bandwidth to reference frequency ratio and a fixed damping factor, independent of processes, applied voltages and temperatures. Such features allow the bandwidth to be a fraction of a designed reference frequency, and the fraction is adjusted to reduce the phase noises of the voltage controlled oscillator (VCO), thereby optimizing the output phase noises of the adaptive PLL.

FIG. 1 is a block diagram of a typical PLL 100. In FIG. 1, the PLL 100 includes a phase detector 110, a charge pump 120, a filter 130, a VCO 140 and a frequency divider 150. When the PLL 100 is locked, the frequency of the signal $CK_{OUT}$ produced by the PLL 100 is N times of the frequency of the reference signal $CK_{REF}$.

FIG. 2 is a block diagram of a typical PLL 100 in phase domain. As shown in FIG. 2, in phase domain, the phase detector 110, the charge pump 120 and the filter 130 can be equivalent to $K_d \cdot K_F \cdot F(S)$, and the VCO 140 can be equivalent to $$\frac{K_{VCO}}{s},$$

where $\Phi_O$ indicates phase of the output signal $CK_{OUT}$ and $\Phi_I$ indicates phase of the reference signal $CK_{REF}$. Accordingly, the transfer function $$\frac{\Phi_O}{\Phi_I}$$

can be expressed as:

$$\Delta\Phi \rightarrow \Delta I_{CH} \rightarrow \Delta V_\phi \rightarrow \Delta f \rightarrow \Delta\Phi \quad (1)$$

$$\Phi_O = \underbrace{\left(\Phi_I - \frac{\Phi_O}{N}\right)}_{\Delta\Phi} \cdot I_{CH} \cdot \underbrace{\left(R + \frac{1}{sC}\right)}_{F(S)} \cdot K_{VCO} \cdot \frac{1}{s}$$

$$\Rightarrow \Phi_O\left(1 + \frac{I_{CH}}{N} \cdot \frac{F(S)}{s} \cdot K_{VCO}\right) = \Phi_I \cdot I_{CH} \cdot \frac{F(S)}{s} \cdot K_{VCO}$$

$$\Rightarrow \frac{\Phi_O}{\Phi_I} = \frac{I_{CH} \cdot \frac{F(S)}{s} \cdot K_{VCO}}{1 + \frac{I_{CH}}{N} \cdot \frac{F(S)}{s} \cdot K_{VCO}} = \frac{I_{CH} \cdot \frac{1+sRC}{s^2 \cdot C} \cdot K_{VCO}}{1 + \frac{I_{CH}}{N} \cdot \frac{1+sRC}{s^2 \cdot C} \cdot K_{VCO}}$$

$$= \frac{I_{CH} \cdot (1+sRC) \cdot K_{VCO}}{s^2 C + \frac{I_{CH}}{N} \cdot K_{VCO} + s \cdot \frac{I_{CH}}{N} \cdot RC \cdot K_{VCO}} = \frac{I_{CH} \cdot K_{VCO} + I_{CH} \cdot sRC \cdot K_{VCO}}{s^2 C + \frac{I_{CH}}{N} \cdot K_{VCO} + \frac{I_{CH}}{N} \cdot sRC \cdot K_{VCO}}$$

$$= N \cdot \frac{1 + sRC}{1 + sRC + s^2 \cdot NC/(I_{CH} \cdot K_{VCO})} = N\frac{1 + 2 \cdot \varsigma \cdot (s/\omega_n)}{1 + 2 \cdot \varsigma \cdot (s/\omega_n) + (s/\omega_n)^2},$$

where $\omega_n$ and $\varsigma$ can be expressed as:

$$\omega_n = \sqrt{\frac{I_{CH} \cdot K_{VCO}}{N \cdot C}} \quad (2)$$

$$\varsigma = \frac{1}{2}\sqrt{\frac{1}{N}I_{CH} \cdot K_{VCO}R^2 \cdot C},$$

for $\omega_n$ indicates the loop bandwidth and $\varsigma$ indicates the damping factor. In a typical application, $I_{CH}$ is in proportion to N in order to reduce the affection of N change. However, a PLL product typically requires a constant loop bandwidth $$\frac{\omega_n}{\omega_{REF}}$$

and a constant damping factor $\varsigma$. From equation (2), it is known that $$\frac{\omega_n}{\omega_{REF}}$$

is not a constant, and the loop bandwidth $\omega_n$ and the damping factor $\varsigma$ are a function of the circuit parameters of the PLL 100. Thus, the constant loop bandwidth $$\frac{\omega_n}{\omega_{REF}}$$

and the constant damping factor ζ shown in equation (2) cannot meet with the constant requirement for different applications.

Therefore, it is desirable to provide an improved frequency synthesis system to mitigate and/or obviate the aforementioned problems.

SUMMARY OF THE INVENTION

An object of the present invention is to provide a frequency synthesis system with self-calibrated loop stability and bandwidth, where a damping factor and a bandwidth to reference frequency ratio $$\frac{\omega_n}{\omega_{REF}}$$

of the frequency synthesis system is independent of a value of frequency division of a programmable frequency divider.

Another object of the present invention is to provide a frequency synthesis system with self-calibrated loop stability and bandwidth, which receives different input reference frequencies in order to allow a damping factor ζ and a bandwidth to reference frequency ratio $$\frac{\omega_n}{\omega_{REF}}$$

to be a designed constant, thereby obtaining the response speed optimization and the stability.

A further object of the present invention is to provide a frequency synthesis system with self-calibrated loop stability and bandwidth, which compensates a controllable oscillator and selects an output signal. When the output signal presents a broadband distribution, the damping factor and the bandwidth to reference frequency ratio are sharply changed. Therefore, the damping factor ζ and the bandwidth to reference frequency ratio $$\frac{\omega_n}{\omega_{REF}}$$

can have the best system response speed and stability by the compensation technique.

A further another object of the present invention is to provide a frequency synthesis system with self-calibrated loop stability and bandwidth, which allows a discrete time loop filter to be implemented with a small area into an IC.

According to a feature of the invention, a frequency synthesis system with self-calibrated loop stability and bandwidth is provided, which outputs an output signal based on an input signal. The system includes a detector, a charge pump, a filter, a controllable oscillator and a programmable frequency divider. The detector produces a detection signal based on a logic level difference between the input signal and a feedback signal. The charge pump is connected to the detector in order to produce a control signal based on the detection signal. The filter is connected to the charge pump in order to produce a tuning signal based on the control signal. The controllable oscillator is connected to the filter in order to produce the output signal based on the tuning signal. The programmable frequency divider is connected to the controllable oscillator in order to produce the feedback signal based on the output signal. The filter is a discrete time loop filter.

Other objects, advantages, and novel features of the invention will become more apparent from the following detailed description when taken in conjunction with the accompanying drawings.

DETAILED DESCRIPTION OF THE PREFERRED EMBODIMENT

Figure 3:
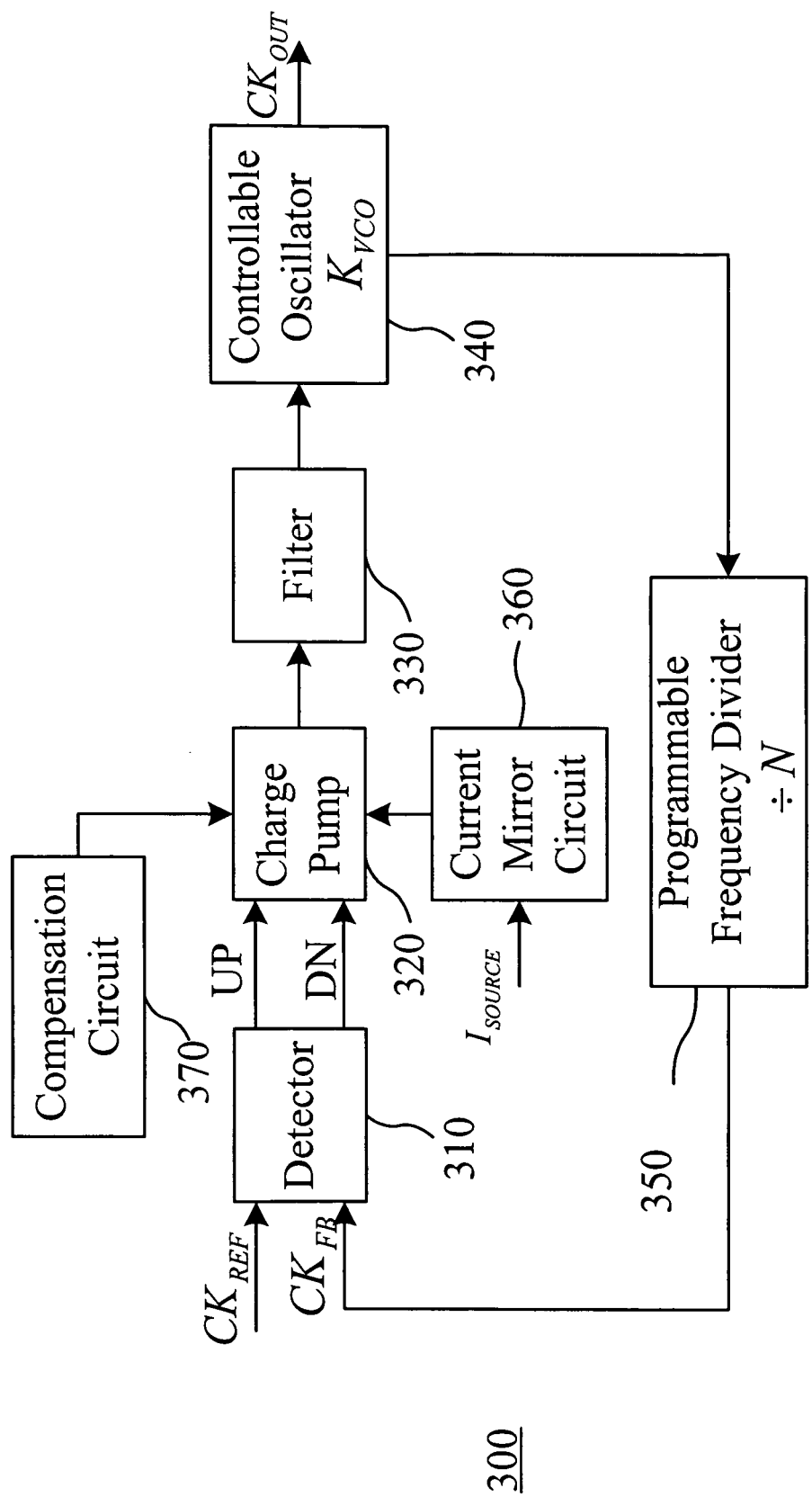
FIG. 3 is a block diagram of a frequency synthesis system with self-calibrated loop stability and bandwidth according to an embodiment of the invention.

FIG. 3 is a block diagram of a frequency synthesis system 300 with self-calibrated loop stability and bandwidth according to an embodiment of the invention. The system 300 is based on an input signal to produce an output signal. In FIG. 3, the system 300 includes a detector 310, a charge pump 320, a filter 330, a controllable oscillator 340, a programmable frequency divider 350, a current mirror circuit 360 and a compensation circuit 370.

The detector 310 produces a detection signal based on a logic level difference between the input signal $CK_{REF}$ and a feedback signal $CK_{FB}$. The detector 310 is based on a phase leading or lagging relationship between the input signal $CK_{REF}$ and the feedback signal $CK_{FB}$ to adjust the detection signal. The detection signal includes a frequency up signal UP and a frequency down signal DN.

When the phase of the input signal $CK_{REF}$ lags that of the feedback signal $CK_{FB}$, the detector 310 outputs the frequency up signal UP to activate the charge pump 320 to charge a capacitor (not shown). The voltage of the capacitor is increased due to the charging operation. When the voltage of capacitor is increased, the frequency $f_{VCO}$ of the output signal $CK_{OUT}$ of the controllable oscillator 340 is also increased to compensate the lagging phase of the input signal $CK_{REF}$. When the phase of the input signal $CK_{REF}$ leads that of the feedback signal $CK_{FB}$, the detector 310 outputs the frequency down signal DN to activate the charge pump 320 to discharge the capacitor. The voltage of the capacitor is decreased due to the discharging operation. When the voltage of capacitor is decreased, the frequency $f_{VCO}$ of the output signal $CK_{OUT}$ of the controllable oscillator 340 is also decreased to pull the leading phase of the input signal $CK_{REF}$ back to a position as same as the phase of the feedback signal $CK_{FB}$.

The charge pump 320 is connected to the detector 310 in order to produce a control signal based on the detection signal.

The filter 330 is connected to the charge pump 320 in order to produce a tuning signal based on the control signal. The filter 330 is a discrete time loop filter, and the discrete time loop filter is a low pass filter. The low pass filter filters out the high frequency component of the control signal to thereby produce the tuning signal.

Figure 4:
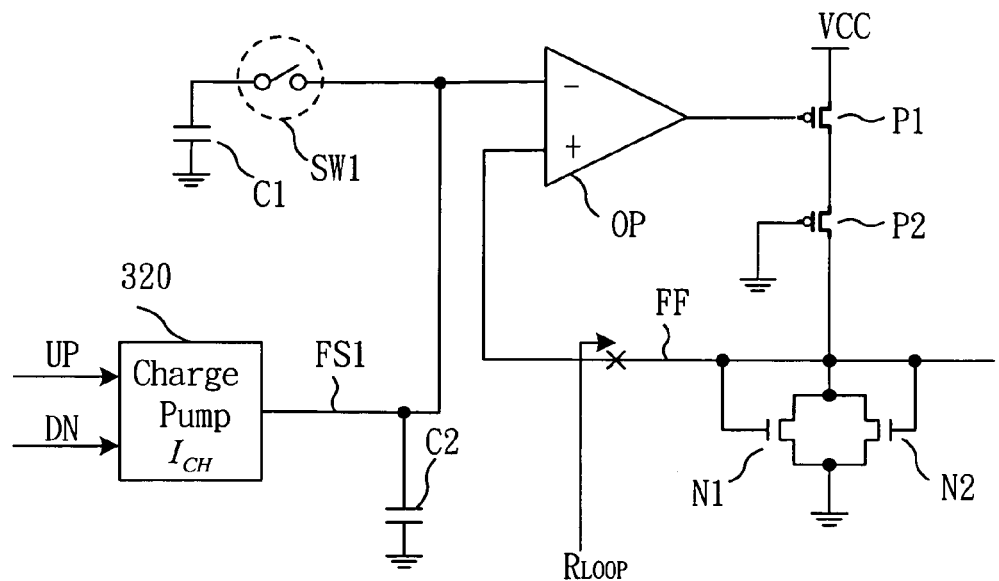
FIG. 4 is a circuit diagram of a low pass filter (LPF) according to an embodiment of the invention.

FIG. 4 is a circuit diagram of the low pass filter (LPF) according to an embodiment of the invention. The LPF includes a first capacitor C1, a second capacitor C2, a first switch SW1, an operational amplifier OP, a first NMOS transistor N1, a second NMOS transistor N2, a first PMOS transistor P1 and a second PMOS transistor P2. In FIG. 4, as compared with the cascaded constant resistor and constant capacitor shown in FIG. 1, the second capacitor C2, the first switch SW1, the operational amplifier OP, the first NMOS transistor N1, the second NMOS transistor N2, the first PMOS transistor P1 and the second PMOS transistor P2 form an equivalent resistor, which is referred to as a $1/g_m$ resistor. The $1/g_m$ resistor has a resistance proportional to the period $T_{VCO}$ of the output signal $CK_{OUT}$.

As shown in FIG. 4, the second capacitor C2 has one end connected to the charge pump 320, one end of the first switch SW1 and a negative input terminal of the operational amplifier OP through a terminal FS1, and the other end connected to a low voltage. The first switch SW1 has the other end connected to one end of the first capacitor C1. The first capacitor C1 has the other end connected to the low voltage. The operational amplifier OP has an output terminal connected to a gate of the first PMOS transistor P1. The first PMOS transistor P1 has a source connected to a high voltage VCC and a drain connected to a source of the second PMOS transistor P2. The second PMOS transistor P2 has a gate connected to the low voltage and a drain connected to a positive input terminal, gate and drain of the first NMOS transistor N1 and gate and drain of the second NMOS transistor N2. The first NMOS transistor N1 and the second NMOS transistor N2 have a source connected to the low voltage. A terminal FF is connected to a next stage circuit. Namely, the tuning signal is output to the controllable oscillator 340 through the terminal FF.

Figure 5:
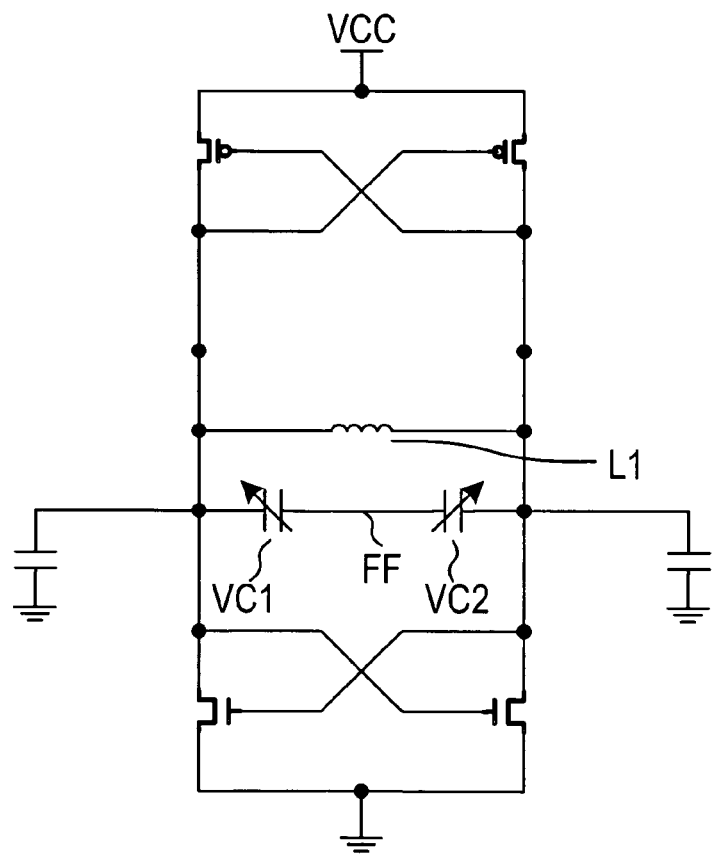
FIG. 5 is a circuit diagram of a controllable oscillator of a typical narrowband system.
Figure 6:
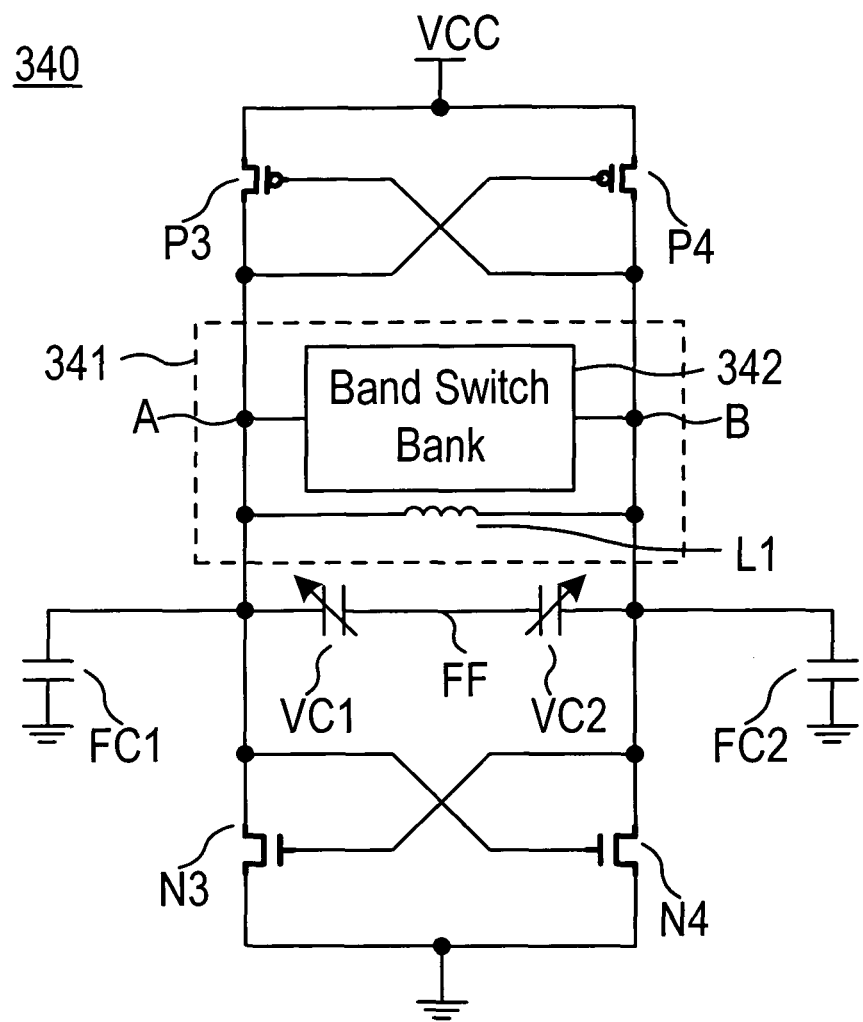
FIG. 6 is a circuit diagram of a controllable oscillator according to an embodiment of the invention.

The controllable oscillator 340 is connected to the filter 330 in order to produce the output signal $CK_{OUT}$ based on the tuning signal. FIG. 5 is a circuit diagram of a typical narrow band controllable oscillator. FIG. 6 is a circuit diagram of a wide band controllable oscillator according to an embodiment of the invention, which is formed of adding a band switch bank 342 to the controllable oscillator of FIG. 5. As shown in FIG. 6, the controllable oscillator 340 includes an inductor-capacitor (LC) tank 341, a first variable capacitor VC1, a second variable capacitor VC2, a first fixed capacitor FC1, a second fixed capacitor FC2, a third NMOS transistor N3, a fourth NMOS transistor N4, a third PMOS transistor P3 and a fourth PMOS transistor P4. The LC tank 341 includes an inductor L1 and the band switch bank 342.

The first fixed capacitor FC1 and the second fixed capacitor FC2 are produced by connection nodes, the inductor L1, and the plurality of active devices (N3, N4, P3, P4). The active devices N3, N4, P3, P4 cooperates with the LC tank 341, the first variable capacitor VC1, the second variable capacitor VC2, the first fixed capacitor FC1 and the second fixed capacitor FC2 to thereby produce the output signal $CK_{OUT}$ with a selectable frequency $f_{VCO}$. The terminal FF between the first variable capacitor VC1 and the second variable capacitor VC2 is identical to the terminal FF shown in FIG. 4, which indicates that both are electrically connected to thereby use the tuning signal to control the capacitances of the first variable capacitor VC1 and the second variable capacitor VC2.

Figure 7:
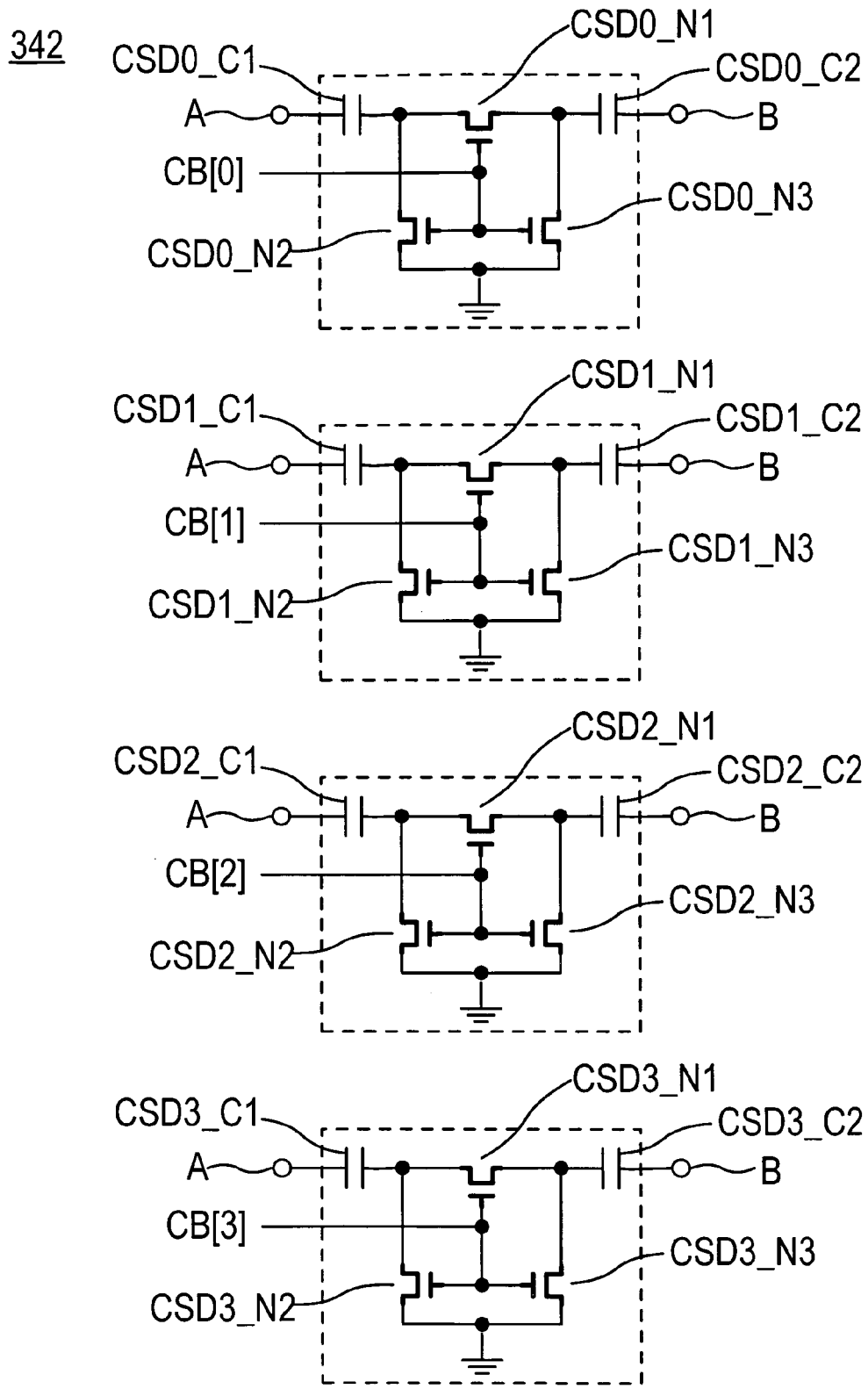
FIG. 7 is a circuit diagram of a band switch bank according to an embodiment of the invention.

FIG. 7 is a circuit diagram of the band switch bank 342 according to an embodiment of the invention. As shown in FIG. 7, the band switch bank includes a plurality of capacitor selecting devices (CSDs) 343. In this embodiment, the band switch bank 342 has four CSDs 343.

A first CSD 343 includes two capacitors CSD0_C1, CSD0_C2 and three switches CSD0_N1, CSD0_N2, CSD0_N3. The three switches CSD0_N1, CSD0_N2, CSD0_N3 are NMOS transistors. One end of the capacitor CSD0_C1 is connected to a terminal A and the other end is connected to a source of the transistor CSD0_N1 and a drain of the transistor CSD0_N2. One end of the capacitor CSD0_C2 is connected to a terminal B and the other end is connected to drains of the transistors CSD0_N1 and CSD0_N3. A gate of the transistors CSD0_N1, CSD0_N2, CSD0_N3 is connected to a control line CB[0]. The sources of transistors CSD0_N2, CSD0_N3 are connected to a low voltage. The terminals A and B in FIG. 7 are identical to the terminals A and B in FIG. 6, which indicates that both are electrically connected, respectively.

When the control line CB[0] is at a high potential, the transistors CSD0_N1, CSD0_N2, CSD0_N3 are turned on, and an equivalent capacitor is formed at the terminals A and B, with a value derived from the cascade capacitors CSD0_C1 and CSD0_C2. When the control line CB[0] is at a low potential, the transistors CSD0_N1, CSD0_N2, CSD0_N3 are turned off, and the capacitors CSD0_C1 and CSD0_C2 are floating. In this case, an open circuit is present at the terminals A and B.

The remaining CSDs 343 have a circuit as same as that of the first CSD 343, and thus the details are not described anymore. In this embodiment, the capacitors of the CSDs 343 can be selected from a base-emitter junction capacitor, a MOSFET capacitor and a poly-poly capacitor. However, in other embodiments, the capacitors of the CSDs 343 can be metal-insulator-metal (MIM) capacitors. In this embodiment, the capacitor CSD0_C1 and the capacitor CSD0_C2 have a same capacitance $c_v$, the capacitor CSD1_C1 and the capacitor CSD1_C2 have a same capacitance which is the double of the capacitance of CSD0_C1, and soon.

As shown in FIGS. 6 and 7, the frequency $f_{VCO}$ of the output signal $CK_{OUT}$ is expressed as:

$$f_{VCO} = \frac{1}{2\pi} \frac{1}{\sqrt{LC}}, \qquad (3)$$

$$= \frac{1}{2\pi} \cdot \frac{1}{\sqrt{L}} \times \frac{1}{\sqrt{\frac{(C_{VAR} + C_{Fix} + \underline{CB[0] \times 2^0 \cdot C_u + CB[1] \times 2^1 \cdot C_u + CB[2] \times 2^2 \cdot C_u + CB[3] \times 2^3 \cdot C_u})}{2}}},$$

From Equation (3), it is known that the part with two underlines indicates the capacitances of the band switch bank 342, $C_{VAR}$ indicates the capacitances of the first and second variable capacitors VC1, VC2, $C_{Fix}$ indicates the first fixed capacitor FC1 and the second fixed capacitor FC2, and L indicates the inductance of the inductor L1.

The programmable frequency divider 350 is connected to the controllable oscillator 340 in order to produce the feedback signal $CK_{FB}$ based on the output signal $CK_{OUT}$.

Figure 8:
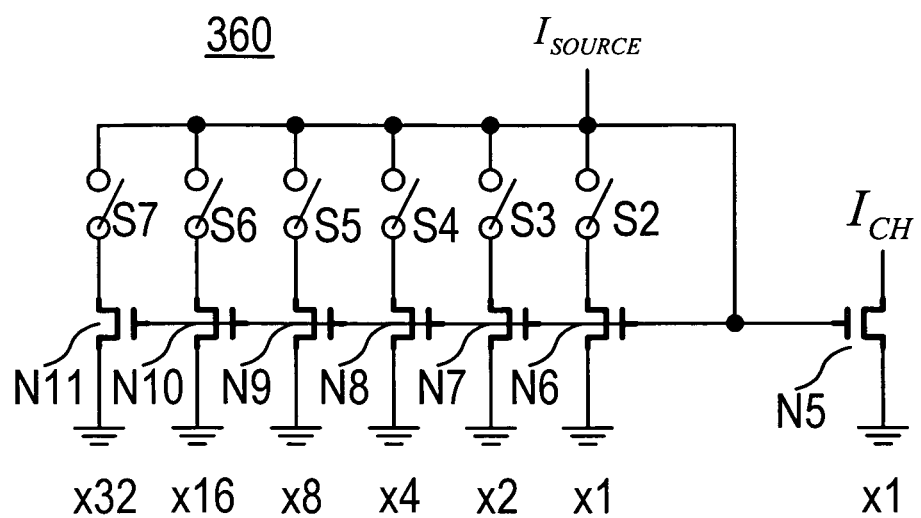
FIG. 8 is a diagram of a current mirror circuit according to an embodiment of the invention.

The current mirror circuit 360 receives a source current $I_{SOURCE}$ to thereby produce a charge pump reference current $I_{CH}$ to the charge pump 320. FIG. 8 is a diagram of the current mirror circuit 360 according to an embodiment of the invention. As shown in FIG. 8, the current mirror circuit 360 includes fifth to eleventh NMOSs N5 to N11 and second to seventh switches SW2 to SW7. The fifth NMOS N5 and the sixth NMOS N6 have a same size, the size of the seventh NMOS N7 is double of that of the sixth NMOS N6, the size of the eighth NMOS N8 is double of that of the seventh NMOS N7, and so on. The second to seventh switches SW2 to SW7 are commonly used by the programmable frequency divider 350 and the current mirror circuit 360 and externally controlled for determining a divisor N of the programmable frequency divider 350.

The charge pump reference current $I_{CH}$ is x times of the source current $I_{SOURCE}$, such that $$x = \frac{1}{N},$$

for N indicates the divisor of the programmable frequency divider 350, i.e., $$I_{CH} = x \cdot I_{SOURCE} = \frac{1}{N} \cdot I_{SOURCE}.$$

When the second switch SW2 and the third switch SW3 are turned on and the remaining switches SW4 to SW7 are off, $I_{CH}=\frac{1}{3} I_{SOURCE}$ and N=3. Namely, the charge pump reference current $I_{CH}$ in FIG. 8 can be expressed as:

$$I_{CH} = \frac{1}{2^0 \cdot S[2] + 2^1 \cdot S[3] + 2^2 \cdot S[4] + 2^3 \cdot S[5] + 2^4 \cdot S[6] + 2^5 \cdot S[7]} I_{SOURCE}.$$

$S[2]=1$ when the second switch SW2 is turned on, $S[2]=0$ when the second switch SW2 is turned off, $S[3]=1$ when the third switch SW3 is turned on, $S[3]=0$ when the third switch SW3 is turned off, and so on.

The compensation circuit 370 is connected to the charge pump 320 in order to produce a compensation current $I_D$ based on the charge pump reference current $I_{CH}$. The compensation current $I_D$ is a substantial charge pump current for compensating the variation of the damping factor and the bandwidth to reference frequency ratio caused by the sharp capacitance change of the LC tank 341. The relation between the compensation current $I_D$ and the charge pump reference current $I_{CH}$ is expressed as $$I_D = \frac{1}{\Psi} I_{CH}$$

for $\Psi$ indicates a designed fraction or positive integer.

Figure 1:
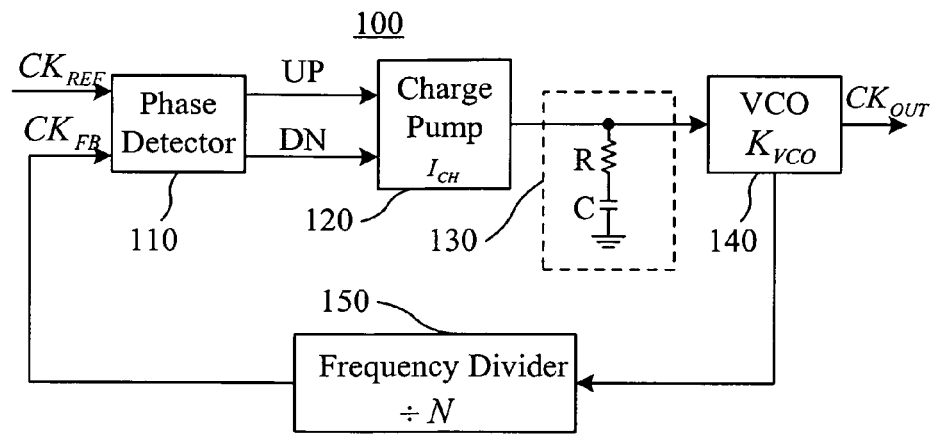
FIG. 1 is a block diagram of a typical phase locked loop (PLL)
Figure 2:
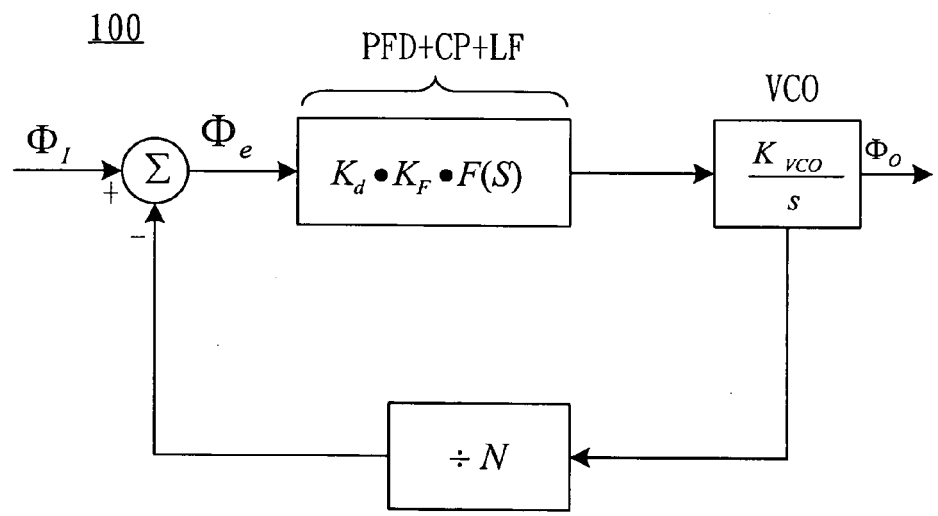
FIG. 2 is a block diagram of a typical phase locked loop (PLL) in phase domain.

For understanding how the invention improves the disadvantages in the prior art and reaches to the objects, a comparative analysis between the invention and the prior art is done as follows. From Equation (2) above, it is known that loop bandwidth $\omega_n$ and the damping factor $\zeta$ within the prior art are fixed to a constant by keeping the charge pump reference current $I_{CH}$ proportional to N. Therefore it can not be adjusted for different applications. In this case, $$\frac{\omega_n}{\omega_{REF}}$$

is not a constant and not changeable based on the frequency of the reference signal, so the system response speed is not optimized and is hard to prevent stability limitation on the bandwidth smaller than $\frac{1}{10}$ of the reference signal. To overcome this, the fixed resistor R in FIG. 1 is replaced with a discrete time loop filter to thereby produce a switch capacitor equivalent resistor $R_{eq}$.

Also, the charge pump reference current $I_{CH}$ is adjusted as x times of the source current $I_{SOURCE}$, i.e., the switch capacitor equivalent resistor $R_{eq}$ is expressed as:

$$R_{eq} = \frac{1}{f_{REF} \cdot C_S} = \frac{N}{f_{VCO} \cdot C_S}, \qquad (4)$$

and after the adjustment, the charge pump reference current becomes:

$$I_{CH} = x \cdot I_{SOURCE}. \qquad (5)$$

Taking Equation (4) and Equation (5) into Equation (2), it is found:

$$\omega_N = \sqrt{\frac{I_{CH} \cdot K_{VCO}}{N \cdot C}} \qquad (6)$$

-continued $$\Rightarrow \frac{\omega_N}{\omega_{REF}} =$$

$$\frac{\sqrt{\frac{(x \times I_{SOURCE}) \cdot K_{VCO}}{N \cdot C}}}{2\pi \times f_{VCO}/N} = \sqrt{\frac{(x \cdot N \times I_{SOURCE}) \cdot \frac{K_{VCO}/C}{2\pi \times f_{VCO}}}{}}$$

$$\Rightarrow \frac{\omega_N}{\omega_{REF}} \propto \sqrt{x \cdot N} .$$

Similarly, $$\zeta = \frac{1}{2} \sqrt{\frac{1}{N} I_{CH} \cdot K_{VCO} R^2 \cdot C} \tag{7}$$

$$\Rightarrow \frac{1}{2} \sqrt{\frac{1}{N} (x \times I_{SOURCE}) \cdot K_{VCO} \cdot C} \times \frac{N}{f_{VCO} \cdot C_s} = \tag{8}$$

$$\frac{1}{2} \sqrt{(x \cdot N \times I_{SOURCE}) \cdot K_{VCO} \cdot C} \times \frac{1}{f_{VCO} \cdot C_s}$$

$$\Rightarrow \zeta \propto \sqrt{x \cdot N} .$$

From Equation (6) and Equation (8) above, for both the damping factor ζ and the bandwidth to reference frequency ratio $$\frac{\omega_n}{\omega_{REF}}$$

proportional to √x·N, the damping factor ζ and the bandwidth to reference frequency ratio $$\frac{\omega_n}{\omega_{REF}}$$

are a constant at $$N = \frac{1}{x}.$$

However, such a configuration can have the effect of switch caused charge burst. To overcome this, the filter shown in FIG. 4 is used, which picks a phase error charge, eliminates it after one period and re-picks another phase error charge. The detail operation of the filter is described as follows.

As shown in FIG. 4, the voltage change ΔV caused by the charge pump 320 at the terminal FS1 is stored in the second capacitor C2. The voltage change ΔV is defined as $$\frac{Q_I}{C_2}.$$

The current change caused by the voltage change ΔV at the terminal FF is defined as $$\Delta V \times 2g_m \left( = \frac{Q_I}{C_2} \times 2g_m \right).$$

The current change lasts one period $$T_{REF} \left( = \frac{N}{f_{VCO}} = N \times T_{VCO} \right),$$

and accordingly the charge $Q_O$ produced at the terminal FF can be expressed as:

$$Q_O = \frac{Q_I}{C_2} \times 2g_m \times N \times T_{VCO}. \tag{9}$$

Further, a variable y is defined as a ratio of an equivalent resistance of the discrete time loop filter to an equivalent small signal model resistor of the first and second NMOS transistors N1 and N2, which are diode-connected for connecting gates and drains of the first and second NMOS transistors N1 and N2 to the terminal FF and connecting sources of the first and second NMOS transistors N1 and N2 to the ground. Accordingly, Equation (10) is shown as follows.

$$y \triangleq \frac{Q_O}{Q_I} = \frac{2g_m}{C_2} \times N \times T_{VCO} = \frac{2g_m}{C_2} \times N \times \frac{1}{f_{VCO}}. \tag{10}$$

As shown in FIG. 4, the equivalent resistance $R_{loop}$ seen across the terminal FF and the ground is expressed as:

$$R_{loop} = y \left( \frac{1}{g_m} // \frac{1}{g_m} \right) = \frac{y}{2 \times g_m}. \tag{11}$$

Taking Equation (11) into Equation (10), the damping factor can be found:

$$\zeta = \frac{1}{2} \sqrt{\frac{1}{N} \cdot I_{CH} \cdot K_{VCO} \cdot C_1} \times R_{Loop} \tag{12}$$

$$= \frac{1}{2} \sqrt{\frac{1}{N} \cdot x \cdot (2 \cdot I_D) \cdot K_{VCO} \cdot C_1} \times \frac{y}{2 \cdot g_m}$$

$$= \frac{1}{2} \sqrt{\frac{1}{N} \cdot x \cdot (2 \cdot I_D) \cdot C_1} \times$$

$$\left\{ \frac{1}{2 \cdot g_m} \underbrace{\left[ \frac{2 \cdot g_m}{C_2} \times N \times \frac{1}{f_{VCO}} \right]}_{y} \right\} \times \sqrt{K_{VCO}}$$

$$= 2\sqrt{x \cdot N} \times \sqrt{2L} \times \sqrt{\frac{C_1}{C_2^2}} \times \frac{1}{f_{VCO}} \times \sqrt{I_D} \times \sqrt{K_{VCO}} ,$$

$$\Rightarrow \zeta \propto \sqrt{x \cdot N} \times \frac{1}{f_{VCO}} \times \sqrt{I_D} .$$

Figure 9:
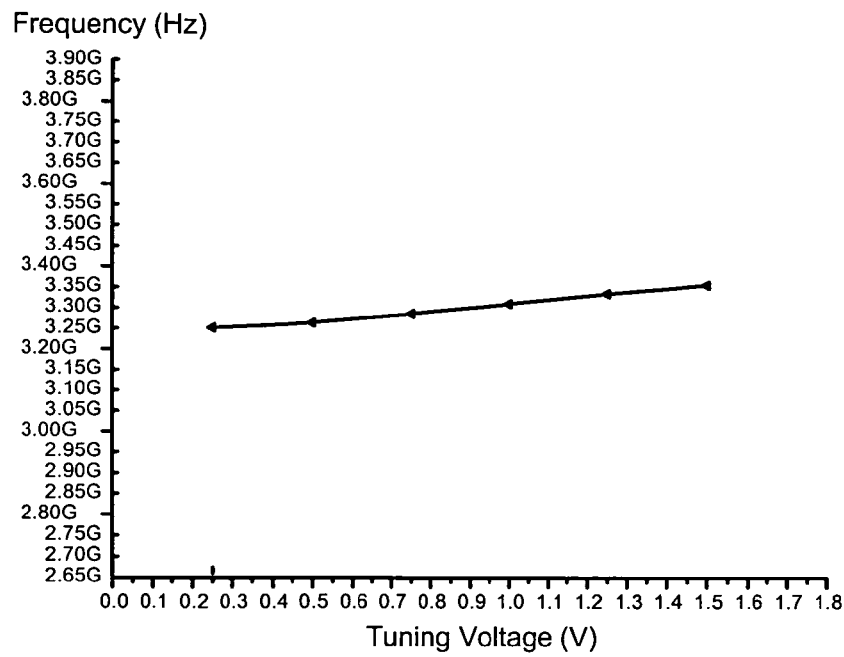
FIG. 9 is a schematic graph of tuning voltage versus frequency for a typical narrowband system.

FIG. 9 is a schematic graph of tuning voltage versus frequency for the typical narrowband system of FIG. 5, in which the tunable frequency range is quite narrow. Accordingly, $$\frac{1}{f_{VCO}}$$

in Equation (12) can be regarded as a constant for the narrowband system, and the damping factor ζ and the bandwidth to reference frequency ratio $$\frac{\omega_n}{\omega_{REF}}$$

are also a constant for $$N = \frac{1}{x},$$

when $K_{VCO}$ and $\sqrt{I_D}$ are a constant.

Figure 10:
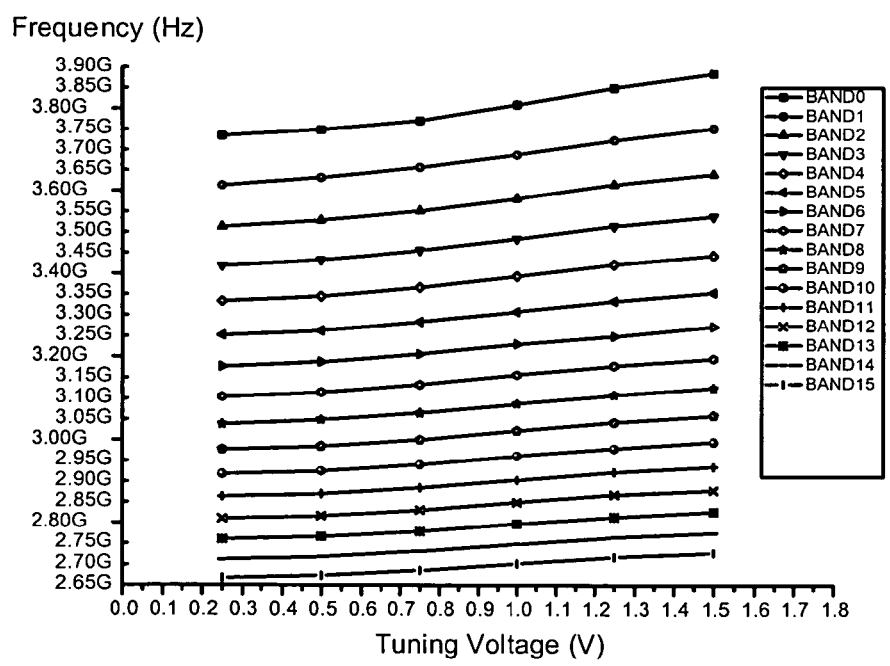
FIG. 10 is a schematic graph of tuning voltage versus frequency for a broadband system according to an embodiment of the invention.

This is improved in the invention due to the band switch bank 342 of the LC tank 341. Thus, the broadband frequency tuning is obtained. For example, as shown in FIG. 7, the control lines CB[0] to CB[3] can provide 16 bands in selection and tuning. FIG. 10 is a schematic graph of tuning voltage versus frequency for a broadband system according to an embodiment of the invention. As shown in FIG. 10, due to the control lines CB[0] to CB[3], the selectable bands in the invention are provided more than those in the prior art. Thus, the broadband frequency tuning is achieved. Namely, the controllable oscillator in the typical narrowband system of FIG. 5, $$\frac{1}{f_{VCO}}$$

in Equation (12) can be expressed as:

$$f_{VCO} = \frac{1}{2\pi} \frac{1}{\sqrt{LC_{Tank}}}.$$

Equation (12) can be rewritten as:

$$\Rightarrow \zeta \propto \sqrt{x \cdot N} \times \left(\frac{1}{2\pi} \frac{1}{\sqrt{LC_{Tank}}}\right)^{-1} \times \sqrt{I_D} \quad (13)$$

$$\Rightarrow \zeta \propto \sqrt{x \cdot N} \times \sqrt{C_{Tank}} \times \sqrt{I_D}.$$

where $C_{Tank}$ can be expressed as:

$$C_{Tank} = \frac{C_{VAR} + C_{FIX}}{2}.$$

In the controllable oscillator 340 of the invention, when the active devices N3, N4, P3, P4 cooperate with the LC tank 341, the first variable capacitor VC1, the second variable capacitor VC2, the first fixed capacitor FC1 and the second fixed capacitor FC2 to thereby produce the output signal $CK_{OUT}$ with the selectable frequency $f_{VCO}$, $C_{Tank}$ in Equation (13) can be expressed as:

$$C_{Tank} = \frac{C_{VAR} + C_{FIX} + CB[0] \times 2^0 \cdot C_U + CB[1] \times 2^1 \cdot C_U + CB[2] \times 2^2 \cdot C_U + CB[3] \times 2^3 \cdot C_U}{2}.$$

Accordingly, the damping factor ζ can be expressed by Equation (13). When $K_{VCO}$ is a constant and $$x = \frac{1}{N}$$

(i.e., K=N), the damping factor ζ can be rewritten as:

$$\zeta \propto \sqrt{C_{Tank}} \times \sqrt{I_D} \quad (14)$$

or $$\zeta \propto \sqrt{\frac{(C_{VAR} + C_{Fix} + CB[0] \times 2^0 \cdot C_u + CB[1] \times 2^1 \cdot C_u + CB[2] \times 2^2 \cdot C_u + CB[3] \times 2^3 \cdot C_u)}{2}} \times \sqrt{I_D}. \quad (15)$$

Similarly, the bandwidth to reference frequency ratio $$\frac{\omega_n}{\omega_{REF}}$$

can be rewritten as:

$$\because \omega_n = \sqrt{\frac{I_{CH} K_{VCO}}{C_1 N}}$$

$$\therefore \frac{\omega_N}{\omega_{REF}} = \frac{1}{2\pi \cdot \underbrace{f_{REF}}_{\omega_N}} \cdot \sqrt{\frac{I_{CH} K_{VCO}}{C_1 N}} = \frac{1}{2\pi} \frac{N}{f_{VCO}} \cdot \sqrt{\frac{(I_{CH}) \cdot K_{VCO}}{C_1 N}}$$

$$= \frac{N}{2\pi} \underbrace{2\pi \times \sqrt{LC_{Tank}}}_{1/f_{VCO}} \cdot \sqrt{\frac{(I_{CH}) \cdot K_{VCO}}{C_1 N}}$$

$$= \sqrt{N} \times \sqrt{L} \times \sqrt{\frac{C_{Tank} \times I_D}{C_1}} \times \sqrt{K_{VCO}}.$$

Therefore, $\frac{\omega_N}{\omega_{REF}} \propto \sqrt{C_{Tank}} \times \sqrt{I_D}$, and (16)

$$\frac{\omega_N}{\omega_{REF}} \propto \qquad (17)$$

$$\sqrt{\frac{(C_{VAR} + C_{Fix} + CB[0] \times 2^0 \cdot C_u + CB[1] \times 2^1 \cdot C_u + CB[2] \times 2^2 \cdot C_u + CB[3] \times 2^3 \cdot C_u)}{2}} \times \sqrt{I_D}.$$

Figure 11:
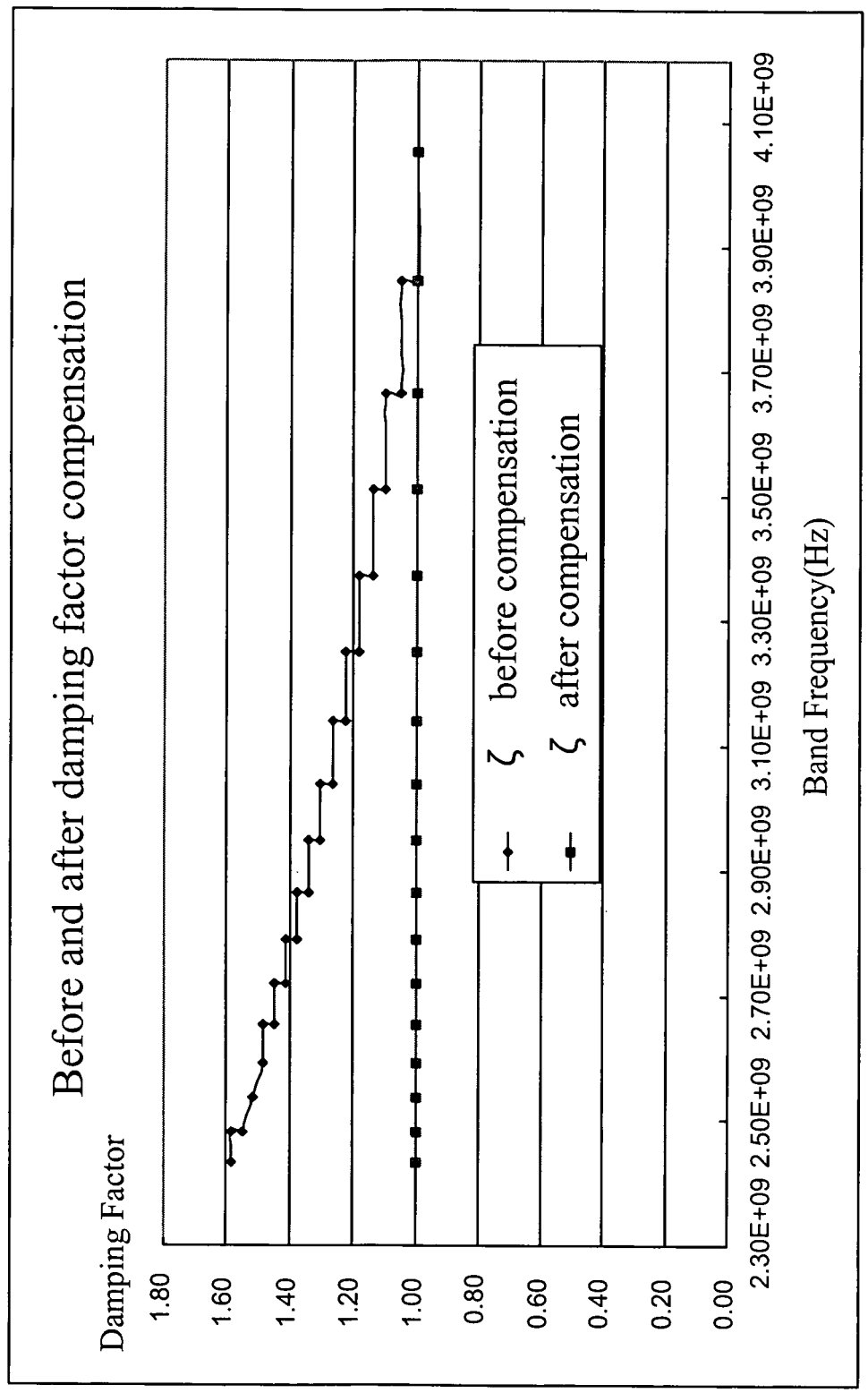
FIG. 11 is a schematic graph of a simulation of damping factor according to an embodiment of the invention.
Figure 12:
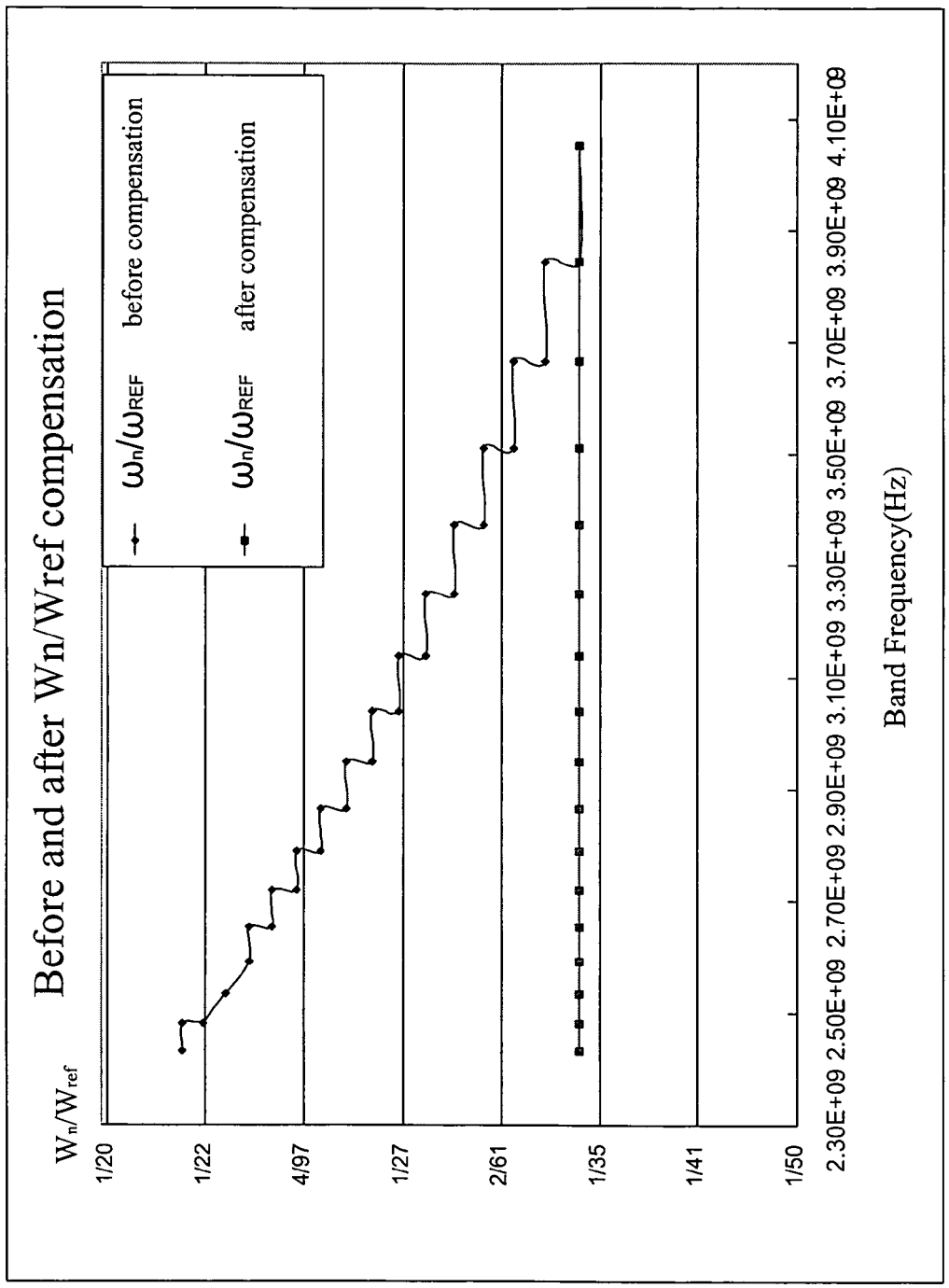
FIG. 12 is a schematic graph of a simulation of bandwidth to reference frequency ratio according to an embodiment of the invention.

From Equation (15) and Equation (17), it is known that the control lines CB[0] to CB[3] are used to select sub-bands to thereby complete the bandwidth transfer. However, due to the sub-bands, the corresponding damping factor $\zeta$ and bandwidth to reference frequency ratio $$\frac{\omega_n}{\omega_{REF}}$$

cause the equivalent capacitance $C_{Tank}$ of the controllable oscillator 340 is sharply changed to thereby significantly change the stability and the loop dynamic feature. FIG. 11 is a schematic graph of a simulation of the damping factor $\zeta$ according to an embodiment of the invention. FIG. 12 is a schematic graph of a simulation of the bandwidth to reference frequency ratio $$\frac{\omega_n}{\omega_{REF}}$$

according to an embodiment of the invention. Since the controllable oscillator 340 can produce the output signal $CK_{OUT}$ with the selectable frequency $f_{VCO}$, the damping factor $\zeta$ and the bandwidth to reference frequency ratio $$\frac{\omega_n}{\omega_{REF}}$$

are different in the sub-bands, as shown in FIGS. 11 and 12. Namely, upon the different sub-bands, the frequency synthesis system 300 has big different in response speed and stability characteristics.

Figure 13:
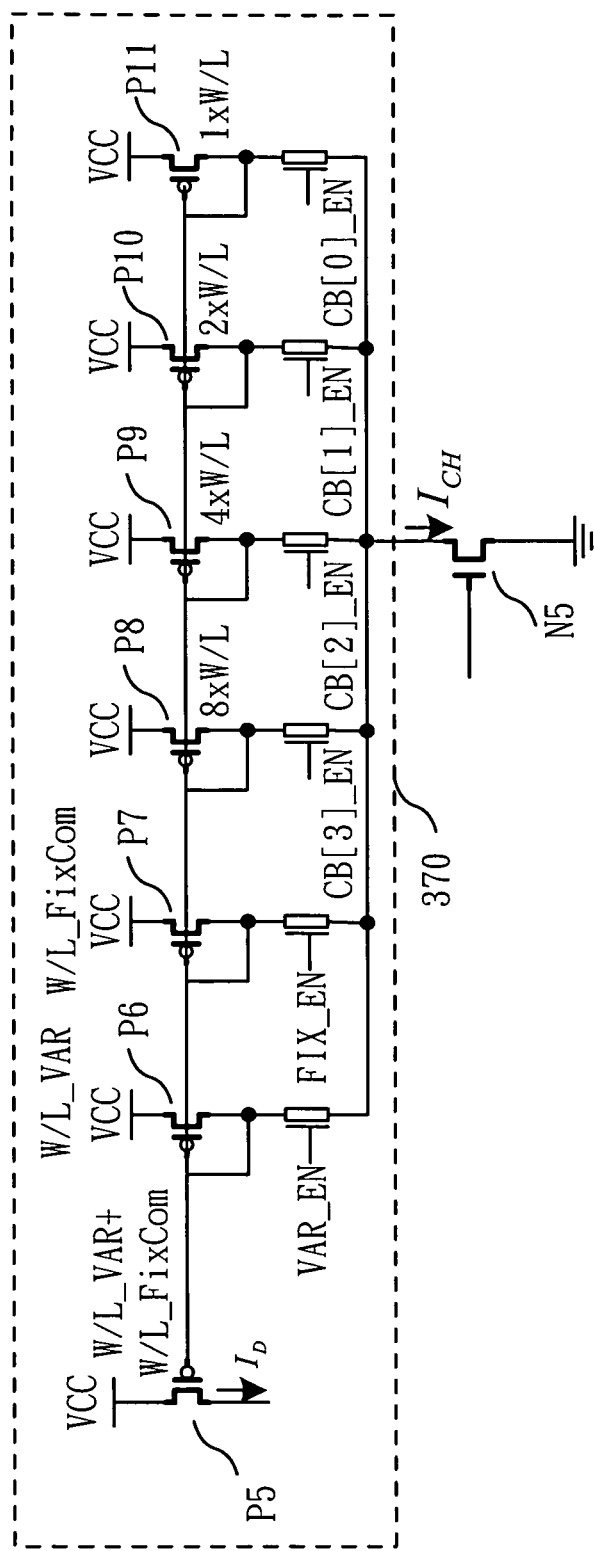
FIG. 13 is a diagram of a compensation circuit according to an embodiment of the invention.

FIG. 13 is a diagram of the compensation circuit 370 according to an embodiment of the invention. In FIG. 13, the compensation circuit 370 is comprised of fifth to eleventh PMOS transistors P5 to P11 and enable switches VAR_EN, FIX_EN, CB[3]_EN, CB[2]_EN, CB[1]_EN, CB[0]_EN. The size of the tenth PMOS transistor P10 is double of that of the eleventh PMOS transistor P11, the size of the ninth PMOS transistor P9 is double of that of the tenth PMOS transistor P10, and the size of the eighth PMOS transistor P8 is double of that of the ninth PMOS transistor P9. In this case, as shown in FIG. 13, the factor $\Psi$ can be expressed as:

$$\Psi = \frac{A_0 \frac{W}{L_{VAR}} + A_1 \frac{W}{L_{FIX}} + CB[0] \cdot B_0 \frac{W}{L_{B[0]}} + CB[1] \cdot B_1 \frac{W}{L_{B[1]}} + CB[2] \cdot B_2 \frac{W}{L_{B[2]}} + CB[3] \cdot B_3 \frac{W}{L_{B[3]}}}{A_0 \frac{W}{L_{VAR}} + A_1 \frac{W}{L_{FIX}}}, \qquad (18)$$

where the factor $\Psi$ can compensate the variation of the damping factor $\zeta$ and the bandwidth to reference frequency ratio $$\frac{\omega_n}{\omega_{REF}}$$

when the controllable oscillator 340 selects the output signal $CK_{OUT}$ with the selectable frequency $f_{VCO}$ as the output. Further, for completely canceling the equivalent capacitance $C_{Tank}$ by means of $\Psi$, the width to length ratios of the transistors P6 and P11 in FIG. 13 meet with $$\frac{\frac{W}{L_{VAR}}}{\frac{W}{L}} = \frac{C_{VAR}}{C_\mu},$$

the width to length ratios of the transistors P7 and P11 meet with $$\frac{\frac{W}{L_{Fix}}}{\frac{W}{L}} = \frac{C_{Fix}}{C_\mu},$$

and the size of the fifth PMOS transistor P5 is as same as that of the shunt transistors P6 and P7, i.e., $$\frac{W}{L_{P5}} = \frac{W}{L_{VAR}} + \frac{W}{L_{FixCom}}.$$

As cited, in the invention, the compensation circuit 370 is based on the charge pump reference current $I_{CH}$ to produce the compensation current $I_D$ for compensating the variation of the damping factor ζ and the bandwidth to reference frequency ratio $$\frac{\omega_n}{\omega_{REF}}$$

when the controllable oscillator 340 selects the output signal $CK_{OUT}$ with the selectable frequency $f_{VCO}$ as the output. In this case, the compensation current $I_D$ is 1/Ψ times of the charge pump reference current $I_{CH}$. Namely, Equation (15) can be rewritten as:

$$\zeta \propto \sqrt{\frac{\left(\begin{array}{c} C_{VAR} + C_{Fix} + \underline{CB[0] \times 2^0 \cdot C_U +} \\ \underline{CB[1] \times 2^1 \cdot C_U + CB[2] \times 2^2 \cdot C_U + CB[3] \times 2^3 \cdot C_U} \end{array}\right)}{2}} \times \left(\frac{1}{\psi} \times I_{CH}\right), \quad (19)$$

From Equation (18) and Equation (19), it is known that the factor Ψ can compensate the variation of the damping factor ζ and the bandwidth to reference frequency ratio $$\frac{\omega_n}{\omega_{REF}}$$

when the controllable oscillator 340 selects the output signal $CK_{OUT}$ with the selectable frequency $f_{VCO}$ as the output, as shown in FIGS. 11 and 12 in which the damping factor ζ and the bandwidth to reference frequency ratio $$\frac{\omega_n}{\omega_{REF}}$$

are fixed in the sub-bands after the compensation. Namely, the damping factor ζ and the bandwidth to reference frequency ratio $$\frac{\omega_n}{\omega_{REF}}$$

have same system response speed and stability in each sub-bands.

Figure 14:
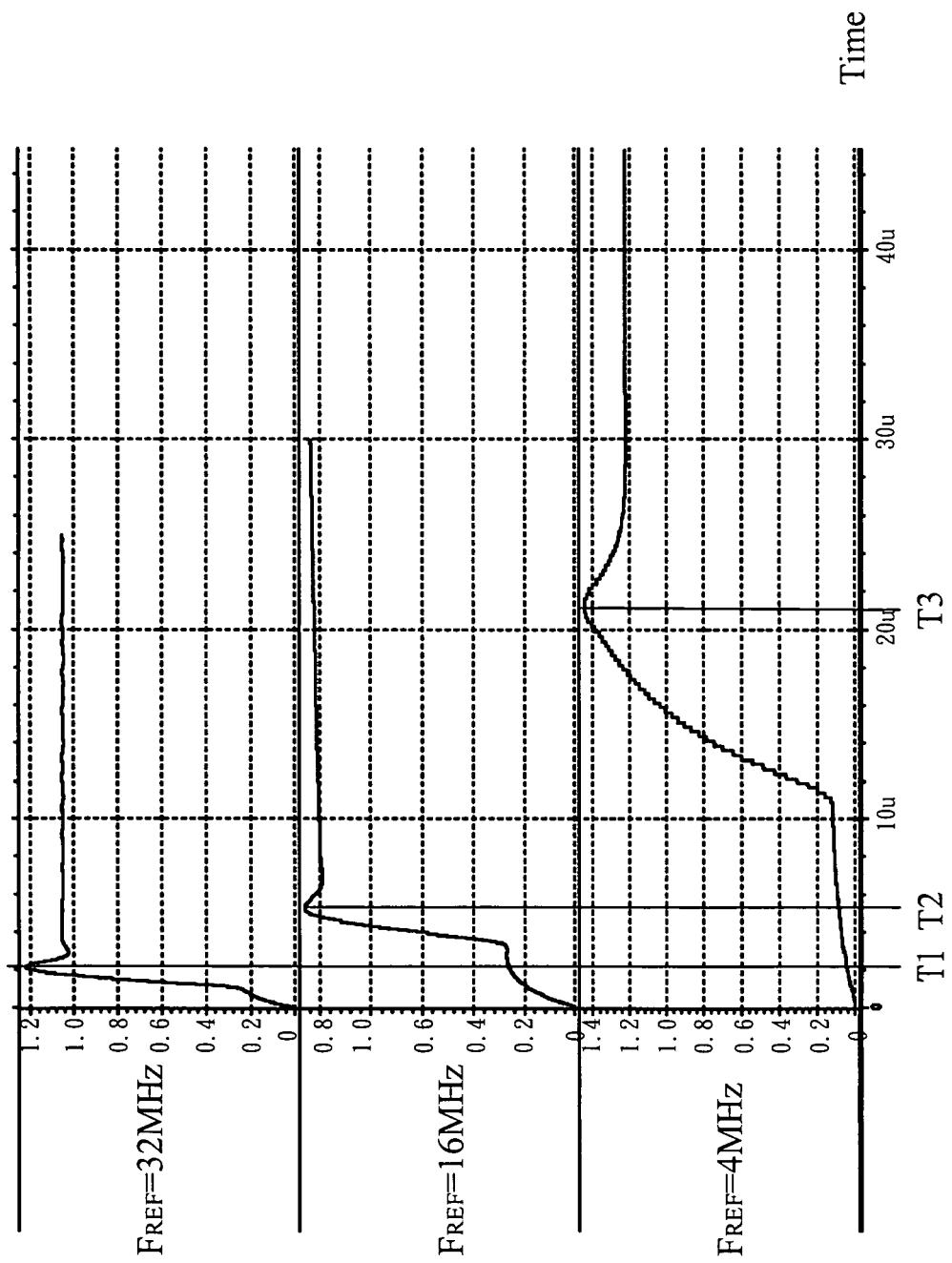
FIG. 14 is a schematic graph of responses of a frequency synthesis system at different reference frequencies according to an embodiment of the invention.

FIG. 14 is a schematic graph of responses of the frequency synthesis system 300 at different reference frequencies according to an embodiment of the invention. As shown in FIG. 14, the system bandwidth is increased with the reference frequency increase and the response time reduction. Namely, the system bandwidth is adjusted based on the frequencies of the reference signal. Accordingly, the frequency synthesis system 300 can receive the reference signal with the different frequencies, without any limit.

Figure 15:
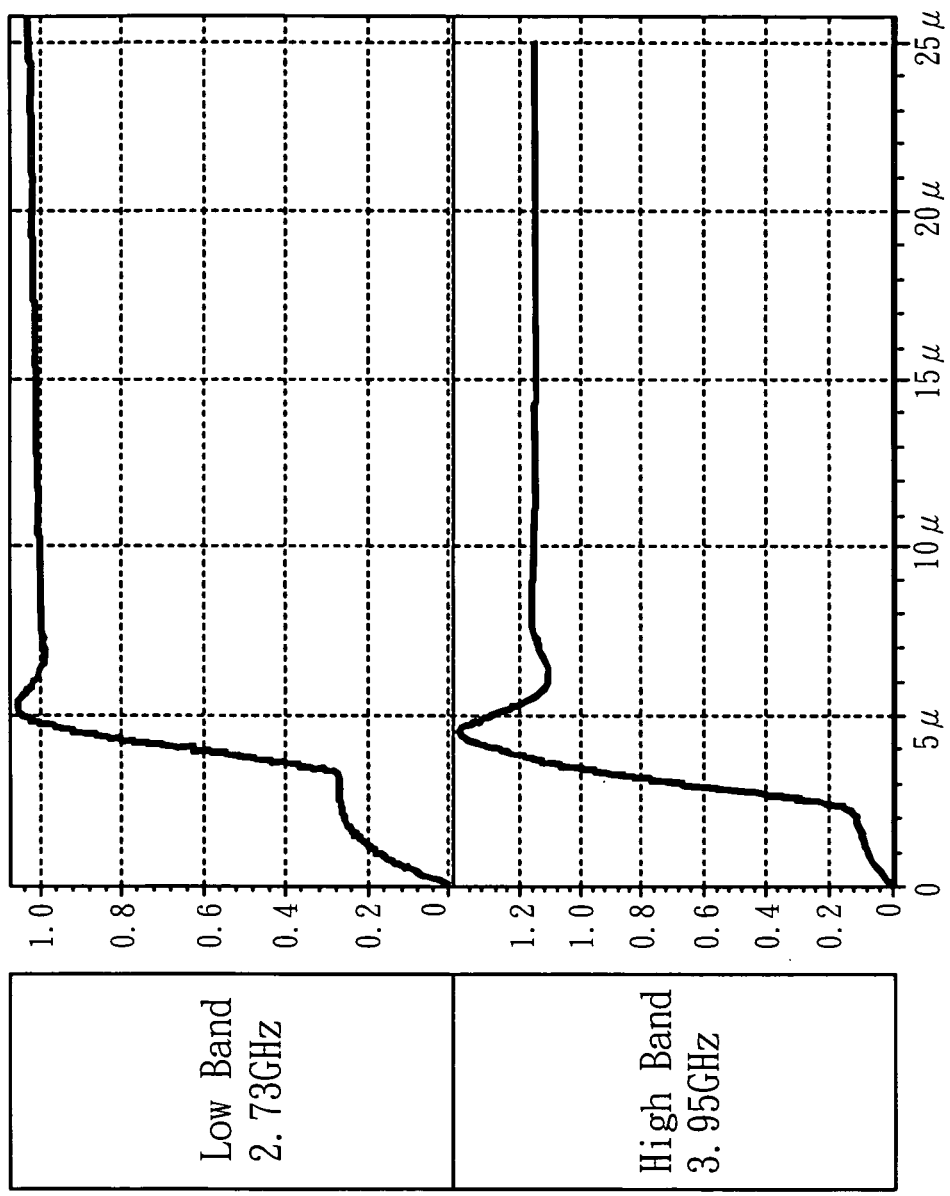
FIG. 15 is a schematic graph of responses of a frequency synthesis system at different bands according to an embodiment of the invention.

FIG. 15 is a schematic graph of responses of the frequency synthesis system 300 at different bands according to an embodiment of the invention. As shown in FIG. 15, the system response time is the same at 2.73 GHz and 3.95 GHz, which indicates that the frequency synthesis system 300 has a same frequency lock position for different N values meaning that it poses same stability and response speed for different output frequencies.

As cited, the invention uses the relation of the charge pump reference current $I_{CH}$ and the source current $I_{SOURCE}$, i.e., $I_{CH} = x \cdot I_{SOURCE}$, lets $$x = \frac{1}{N},$$

and uses the discrete time loop filter in order to make the damping factor ζ and the bandwidth to reference frequency ratio $$\frac{\omega_n}{\omega_{REF}}$$

be independent to N. In addition, the invention uses the relationship between the compensation current $I_D$ and the charge pump reference current $I_{CH}$ to thereby compensate the variation of the damping factor ζ and the bandwidth to reference frequency ratio $$\frac{\omega_n}{\omega_{REF}}$$

when the controllable oscillator 340 selects the output signal $C_{OUT}$ with the selectable frequency $f_{VCO}$ as the output. Further, the invention uses the first capacitor C1, the first switch SW1, the operational amplifier OP, the first NMOS transistor N1, the second NMOS transistor N2, the first PMOS transistor P1 and the second PMOS transistor P2 to produce the resistance (the equivalent resistor) required for the filter 330 to thereby act as a discrete time loop filter, which is not shown in the prior art and can be easily implemented in an IC.

Although the present invention has been explained in relation to its preferred embodiment, it is to be understood that many other possible modifications and variations can be made without departing from the spirit and scope of the invention as hereinafter claimed.

What is claimed is:

1. A frequency synthesis system with self-calibrated loop stability and bandwidth, comprising:
   a detector, producing a detection signal based on a logic level difference between an input signal and a feedback signal;
   a charge pump, connected to the detector to produce a control signal based on the detection signal;
   a filter, connected to the charge pump to produce a tuning signal based on the control signal;
   a controllable oscillator, connected to the filter to produce the output signal based on the tuning signal;
   a programmable frequency divider, connected to the controllable oscillator to produce the feedback signal based on the output signal;
   a current mirror circuit, receiving a source current to produce a charge pump reference current to the charge pump; and
   a compensation circuit, connected to the charge pump to produce a compensation current based on the charge pump reference current for compensating the variation of the damping factor and the bandwidth to reference frequency ratio when the controllable oscillator selectively outputs the output signal;
   wherein the filter is a discrete time loop filter.

2. The frequency synthesis system as claimed in claim 1, wherein the discrete time loop filter is a low pass filter.

3. The frequency synthesis system as claimed in claim 2, wherein the low pass filter comprises a first capacitor, a second capacitor, a first switch, an operational amplifier, a first NMOS transistor, a second NMOS transistor, a first PMOS transistor and a second PMOS transistor.

4. The frequency synthesis system as claimed in claim 3, wherein the first capacitor, the first switch, the operational amplifier, the first NMOS transistor, the second NMOS transistor, the first PMOS transistor and the second PMOS transistor form an equivalent resistor.

5. The frequency synthesis system as claimed in claim 4, wherein one end of the second capacitor is connected to the charge pump, one end of the first switch and a negative input terminal of the operational amplifier, the other end of the first switch is connected to one end of the first capacitor, the other ends of the second capacitor and the first capacitor are connected to a low voltage, an output terminal of the operational amplifier is connected to a gate of the first PMOS transistor, a source of the first PMOS transistor is connected to a high voltage and a drain of the first PMOS is connected to a source of the second PMOS transistor, a gate of the second PMOS transistor is connected to the low voltage and a drain of the second PMOS is connected to a positive input terminal of the operational amplifier and gates and drains of the first and the second NMOS transistors, and sources of the first and the second NMOS transistors are connected to the low voltage.

6. The frequency synthesis system as claimed in claim 1, wherein the controllable oscillator comprises an inductor-capacitor (LC) tank to produce the output signal with a selectable frequency.

7. The frequency synthesis system as claimed in claim 6, wherein the LC tank comprises an inductor and a band switch bank.

8. The frequency synthesis system as claimed in claim 7, wherein the band switch bank comprises a plurality of capacitor selecting devices (CSDs), and each CSD comprises two capacitors and three switches.

9. The frequency synthesis system as claimed in claim 8, wherein the switches comprise NMOS transistors.

10. The frequency synthesis system as claimed in claim 9, wherein the controllable oscillator further comprises a first variable capacitor and a second variable capacitor.

11. The frequency synthesis system as claimed in claim 10, wherein the controllable oscillator further comprises a first fixed capacitor and a second fixed capacitor.

12. The frequency synthesis system as claimed in claim 11, wherein the controllable oscillator further comprises a plurality of active devices to produce the output signal with the selectable frequency by operating with the first variable capacitor, the second variable capacitor, the first fixed capacitor and the second fixed capacitor.

13. The frequency synthesis system as claimed in claim 12, wherein the first and the second fixed capacitors are formed by connection the nodes, the inductor, and the plurality of active devices.

14. The frequency synthesis system as claimed in claim 9, wherein the capacitors in each CSD are a metal-insulator-metal capacitor.

15. The frequency synthesis system as claimed in claim 1, wherein the charge pump reference current equals to x times of the source current to allow the damping factor and the bandwidth to reference frequency ratio to be proportional to $\sqrt{x \cdot N}$, where x indicates a positive integer and N indicates a divisor of the programmable frequency divider.

16. The frequency synthesis system as claimed in claim 15, wherein the compensation current equals to $$\frac{1}{\Psi}$$

times of the charge pump reference current to compensate the variation of the damping factor and the bandwidth to reference frequency ratio when the controllable oscillator selectively outputs the output signal with the selectable frequency, where $\Psi$ indicates a positive integer.

* * * * *